(12) United States Patent
Seong et al.

(10) Patent No.: US 8,520,186 B2
(45) Date of Patent: Aug. 27, 2013

(54) ACTIVE SPECTRAL CONTROL OF OPTICAL SOURCE

(75) Inventors: Nakgeuon Seong, San Diego, CA (US);
Ivan B. Lalovic, San Francisco, CA (US); Nigel R. Farrar, Poway, CA (US);
Robert J. Rafac, Encinitas, CA (US);
Joseph J. Bendik, Escondido, CA (US)

(73) Assignee: Cymer, LLC, San Diego, CA (US)

( * ) Notice: Subject to any disclaimer, the term of this patent is extended or adjusted under 35 U.S.C. 154(b) by 202 days.

(21) Appl. No.: 12/860,288

(22) Filed: Aug. 20, 2010

(65) Prior Publication Data

US 2011/0205512 A1    Aug. 25, 2011

Related U.S. Application Data

(60) Provisional application No. 61/236,848, filed on Aug. 25, 2009.

(51) Int. Cl.
*G03B 27/68*    (2006.01)
*G03B 27/42*    (2006.01)

(52) U.S. Cl.
USPC ............................................ 355/52; 355/53

(58) Field of Classification Search
USPC .................. 355/52, 53, 55, 67–71; 250/548, 250/492.2
See application file for complete search history.

(56) References Cited

U.S. PATENT DOCUMENTS

| | | | |
|---|---|---|---|
| 4,937,619 A | 6/1990 | Fukuda | |
| 5,194,893 A | 3/1993 | Nishi | |
| 5,303,002 A | 4/1994 | Yan | |
| 5,742,376 A * | 4/1998 | Makinouchi | 355/53 |
| 6,218,077 B1 | 4/2001 | Jin | |
| 6,393,037 B1 | 5/2002 | Basting | |
| 6,671,294 B2 * | 12/2003 | Kroyan et al. | 372/20 |
| 6,809,797 B2 | 10/2004 | Baselmans et al. | |
| 6,829,040 B1 | 12/2004 | Kye et al. | |
| 6,853,653 B2 | 2/2005 | Spangler et al. | |
| 6,862,079 B2 | 3/2005 | Sato | |
| 6,952,267 B2 | 10/2005 | Rarac | |
| 7,053,979 B2 | 5/2006 | Smith et al. | |
| 7,088,758 B2 | 8/2006 | Sandstrom | |

(Continued)

OTHER PUBLICATIONS

H. Fukuda et al., "Improvement of defocus tolerance in a half-micron optical lithography by the focus latitude enhancement exposure method: Simulation and experiment," J. Vac. Sci. Technol. B7 (4), 1989, pp. 667-674.

(Continued)

*Primary Examiner* — Hung Henry Nguyen
(74) *Attorney, Agent, or Firm* — DiBerardino McGovern IP Group LLC

(57) ABSTRACT

A method of controlling a spectral property of a light beam includes directing a light beam to a lithography exposure apparatus configured to create a pattern on a wafer; receiving information representative of a spectral property of the light beam; receiving information representative of an optical imaging condition of the lithography exposure apparatus; estimating a characteristic value of the light beam based on the received spectral property information and the received optical imaging condition information; determining whether the estimated light beam characteristic value matches a target light beam characteristic value; and if it is determined that the estimated light beam characteristic value does not match the target light beam characteristic value, adjusting the spectral property of the light beam.

20 Claims, 5 Drawing Sheets

(56) References Cited

U.S. PATENT DOCUMENTS

| | | |
|---|---|---|
| 7,139,301 B2 | 11/2006 | Kroyan |
| 7,154,928 B2 | 12/2006 | Sandstrom |
| 7,277,466 B2 | 10/2007 | Partlo et al. |
| 7,317,536 B2 | 1/2008 | Rafac |
| 7,366,219 B2 | 4/2008 | Algots |
| 7,455,939 B2 | 11/2008 | Brunner |
| 7,653,095 B2 | 1/2010 | Reiley |
| 7,701,555 B2 * | 4/2010 | Arai ................................ 355/67 |
| 7,822,084 B2 | 10/2010 | O'Brien et al. |
| 2003/0133487 A1 | 7/2003 | Vogler |
| 2004/0146082 A1 | 7/2004 | Kroyan et al. |
| 2005/0041701 A1 | 2/2005 | Spangler et al. |
| 2005/0068997 A1 | 3/2005 | Spangler et al. |
| 2006/0114956 A1 | 6/2006 | Sandstrom et al. |
| 2007/0195836 A1 | 8/2007 | Dunstan |
| 2007/0273852 A1 | 11/2007 | Arai |
| 2007/0297467 A1 | 12/2007 | Fomenkov |
| 2008/0253408 A1 | 10/2008 | Ishihara |
| 2008/0253413 A1 | 10/2008 | Partlo |
| 2009/0011346 A1 | 1/2009 | Ausschnitt |
| 2010/0149647 A1 | 6/2010 | Figueroa |
| 2010/0165315 A1 * | 7/2010 | Tanaka ............................ 355/67 |

OTHER PUBLICATIONS

I. Lalovic et al., "Relax: Resolution Enhancement by Laser-spectrum Adjusted Exposure," Proc. SPIE Optical Microlithography XVIII 5754, (2005), pp. 447-455.

I. Lalovic et al., "Illumination spectral width impacts on mask error enhancement factor and iso-dense bias in 0.6 Na KrF imaging," Proc. BACUS XXI Photomask Technology Symposium 4562, 112 (2001), 8 pages.

M. Terry et al., "Behavior of lens aberrations as a function of wavelength on KrF and ArF lithography scanners," Proc. SPIE Optical Microlithography XIV 4346, 15 (2001), 11 pages.

K. Lai et al., "Understanding chromatic aberration impacts on lithographic imaging," Journal of Microlithography, Microfabrication, and Microsystems (JM3), vol. 2, No. 2, pp. 105-111 (2003).

J. Bakaert et al., "Effect of laser bandwidth tuning on line/space and contact printing at 1.35 NA," Proceedings of the 5th International Symposium on Immersion Lithography Extensions, The Hague, Netherlands, Sep. 22-25, 2008.

A. Kroyan et al., "Effects of 95% integral vs. FWHM bandwidth specifications on lithographic imaging," Proc. SPIE Optical Microlithography XIV 4346, 1244 (2001), 10 pages.

I. Lalovic et al., "Defining a physically-accurate laser bandwidth input for optical proximity correction (OPC) and modeling," Proc. BACUS XXII Photomask Technology Symposium 7122 -62 (2008), 11 pages.

P. De Bisschop et al., "Impact of finite laser bandwidth on the CD of L/S structures," Journal of Micro / Nanolithography, MEMS and MOEMS (JM3), vol. 7, No. 3, (2008), pp. 033001-1-16.

M. Smith et al., "Modeling and Performance Metrics for Longitudinal Chromatic Aberrations, Focus drilling, and Z-noise; exploring excimer laser pulse spectra," Proc. SPIE Optical Microlithography XX 6520-127 (2007), 8 pages.

U. Iessi et al., "Laser bandwidth effect on overlay budget and imaging for the 45 nm and 32 nm technology nodes immersion mmersion lithography," Proc. SPIE Optical Microlithography XXII 7640 (2010), 12 pages.

Kevin Huggins et al., "Effects of laser bandwidth on OPE in a modern lithography tool," Proc. SPIE Optical Microlithography XIX 6154, 61540Z (2006).

Robert J. Rafac, "Overcoming limitations of etalon spectrometers used for spectral metrology of DUV excimer light sources", Proc. SPIE Optical Microlithography XVII 5377, 846 (2004).

Ivan Lalovic et al., "Depth of focus enhancement by wavelength modulation: Can we RELAX and improve focus latitude?," presented at Arch Chemical 2003 Interface Symposium, San Diego, CA, Sep. 21-23, 2003.

Armen Kroyan et al., "Contribution of polychromatic illumination to optical proximity effects in the context of deep-UV lithography," Proc. BACUS XXI Photomask Technology Symposium 4562, 125 (2001).

Kafai Lai et al., "Chromatic aberration impacts on 0.68NA KrF lithographic imaging," Interface Microlithography Symposium Proceedings (2001).

Ivan Lalovic et al., "Investigation of cross-field wavefront aberrations of KrF lithography exposure systems as a function of excimer laser bandwidth," Proc. SPIE Optical Microlithography XIV 4346, 1262 (2001).

A. Kroyan et al., "Modeling the effects of eximer laser bandwidths on lithographic performance," Proc. SPIE 4000, 658 (2000).

P. Yan, et al., "Effects of chromatic aberration in excimer laser lithography," Proc. SPIE 1674, 316 (1992).

H. Fukuda et al., "A New Method for Enhancing Focus Latitude in Optical Lithography: FLEX," IEEE Electron Device Letters, vol. EDL-8, No. 4, pp. 179-180 (Apr. 1987).

"Laser bandwidth and other sources of focus blur in lithography," T. Brunner et al., Optical Microlithography XIX. Edited by Flagello, Donis G. Proceedings of the SPIE, vol. 6154, pp. 323-330 (2006).

"Active Spectral Control of DUV light sources for OPE minimization," Wayne J. Dunstan et al., Optical Microlithography XIX, Edited by Donis G. Flagello, Proc. of SPIE, vol. 6154, 61542J, 2006.

"Active spectral-control techniques for improving OPC," Robert Jacques et al., Solid State Technology, Dec. 2006, accessed at http://www.electroiq.com/ElectroIQ/en-us/index/display/Semiconductor_Article_Tools_Template.articles.solid-state-technology.volume-49.issue-12.features.lithography.active-spectral-control-techniques-for-improving-opc.html.

International Search Report and Written Opinion of the International Searching Authority, Lee W. Young, Oct. 14, 2010 in related application PCT/US10/02320, 8 pages.

The State Intellectual Property Office of the People's Republic of China, Notice on the First Office Action and Search Report in Counterpart CN Application No. 201080038324.4 dated May 6, 2013, 16 pages.

* cited by examiner

ACTIVE SPECTRAL CONTROL OF OPTICAL SOURCE

CROSS REFERENCE TO RELATED APPLICATION

This application claims the benefit of U.S. Application No. 61/236,848, filed Aug. 25, 2009, which is incorporated herein by reference in its entirety.

TECHNICAL FIELD

The disclosed subject matter relates to active spectral control of an optical source that supplies light to a lithography exposure apparatus.

BACKGROUND

An accurate knowledge of spectral properties (for example, a bandwidth) of an optical source such as a laser is important in many scientific and industrial applications. For example, accurate knowledge of the optical source bandwidth is needed to enable control of a minimum feature size or critical dimension (CD) in deep ultraviolet (DUV) optical lithography. The critical dimension is the feature size that needs to be printed on a semiconductor substrate (also referred to as a wafer) and therefore the CD can require tight size control. In optical lithography, the substrate is irradiated by a light beam produced by an optical source. Often, the optical source is a laser source and the light beam is a laser beam. To enhance resolution of the process and to therefore reduce the minimum feature size, a fluid medium having a refractive index greater than one can fill a gap between a final lens of an illuminator of the apparatus and the substrate.

The bandwidth of a light beam is the width of the intensity spectrum of the light beam output from the optical source, and this width can be given in terms of wavelength or frequency of the laser light. Any suitable mathematical construction (that is, metric) related to the details of the optical source spectrum can be used to estimate the bandwidth of the light beam. For example, the full width of the spectrum at a fraction (X) of the maximum peak intensity (referred to as FWXM) can be used to estimate the light beam bandwidth. As another example, a width of the spectrum that contains a fraction (Y) of the integrated spectral intensity (referred to as EY) can be used to estimate the light beam bandwidth.

SUMMARY

In some general aspects, a spectral property of a light beam is controlled. A light beam is directed to a lithography exposure apparatus configured to create a pattern on a wafer. Information representative of a spectral property of the light beam and information representative of an optical imaging condition of the lithography exposure apparatus are received. A characteristic value of the light beam is estimated based on the received spectral property information and the received optical imaging condition information. It is determined whether the estimated light beam characteristic value matches a target light beam characteristic value. And, if it is determined that the estimated light beam characteristic value does not match the target light beam characteristic value, the spectral property of the light beam is adjusted.

Implementations can include one or more of the following features. For example, the light beam can be generated.

The light beam characteristic value can be estimated by estimating a width of a focus blur distribution of the light beam. The light beam characteristic value can be estimated by estimating a width of a spectrum of the light beam. The light beam characteristic value can be estimated by using a metric to approximate the spectrum of the light beam.

The light beam spectral property can be adjusted by adjusting a bandwidth of the light beam.

The spectral property information can be received by receiving a measured bandwidth of the light beam.

The optical imaging condition information can be received by receiving a numerical aperture of projection optics within the lithography exposure apparatus. The optical imaging condition information can be received by receiving information about the pattern to be printed on the wafer. The optical imaging condition information can be received by receiving conditions of an illuminator for the printing of the wafer pattern.

The light beam spectral property can be adjusted by adjusting a bandwidth of the light beam within a first range of bandwidths while operating in a first range mode. The light beam spectral property can be adjusted by adjusting the bandwidth of the light beam within a second range of bandwidths while operating in a second range mode.

Information representative of a mechanical imaging condition of the lithography exposure apparatus can also be received. In this case, the light beam characteristic value is estimated based on the received spectral property information, the received optical imaging condition information, and the received mechanical imaging condition information.

In another general aspect, a light system that produces a light beam configured to be directed to a lithography exposure apparatus that creates a pattern on a wafer. The light system includes an optical source configured to generate the light beam; a beam directing system configured to direct the light beam to the lithography exposure apparatus; a controller; and a spectral property selection system. The controller is configured to receive information representative of a spectral property of the light beam; receive information representative of an optical imaging condition of the lithography exposure apparatus; estimate a characteristic value of the light beam based on the received spectral property information and the received optical imaging condition information; determine whether the estimated light beam characteristic value matches a target light beam characteristic value; and if it is determined that the estimated light beam characteristic value does not match the target light beam characteristic value, outputting a signal indicating an adjustment based on the determination. The spectral property selection system receives the outputted signal and is configured to adjust a spectral property of the light beam.

Implementations can include one or more of the following features. For example, controller can be configured to estimate the light beam characteristic value by estimating a width of a focus blur distribution of the light beam.

The controller can be configured to estimate the light beam characteristic value by estimating a width of a spectrum of the light beam.

The spectral property selection system can include a spectral property control module; and one or more spectral property actuation systems connected to respective optical features that are optically coupled to the light beam of the optical source.

The spectral property selection system can include at least two spectral property actuation systems that enable adjustment of the light beam spectral property in two or more distinct ranges of properties.

The spectral property selection system can be configured to adjust the light beam spectral property by adjusting a bandwidth of the light beam.

The light system can also include a beam analysis module in the path of the light beam and configured to measure spectral property information of the light beam, where the controller is configured to receive the information representative of the spectral property of the light beam from the beam analysis module.

The beam analysis module can include a spectral value measurement system that includes at least one sensor that measures the information representative of the spectral property of the light beam.

The spectral value measurement system can include one or more of interferometric or dispersive instruments.

DRAWING DESCRIPTION

DESCRIPTION

Figure 1:
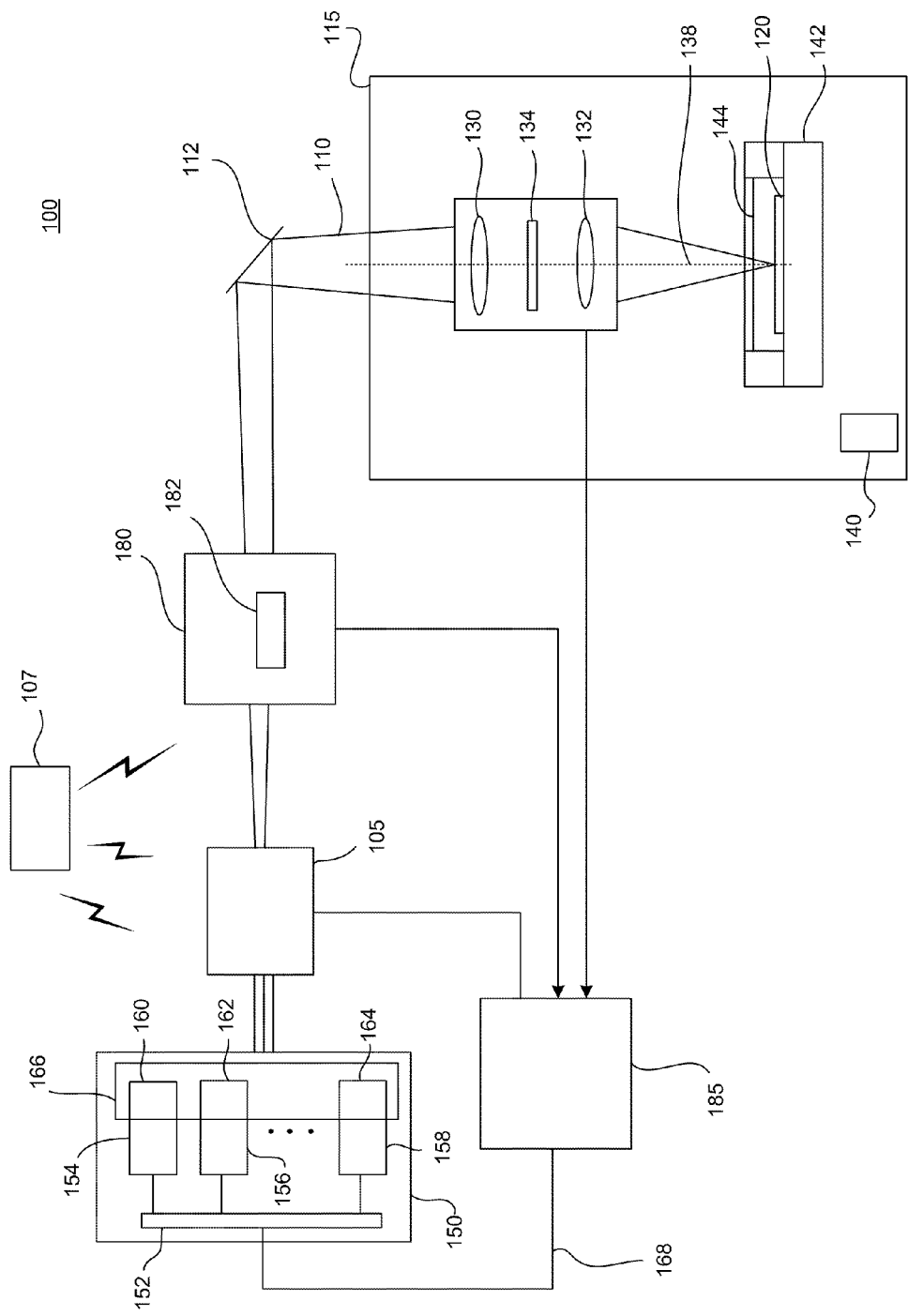
FIG. 1 is a block diagram of a lithography system.

Referring to FIG. 1, a lithography system 100 includes an optical source 105 supplying a light beam 110, which is directed through a beam directing system 112 to a lithography exposure apparatus 115 that creates a pattern on a wafer 120. The lithography system 100 also includes a spectral property selection system 150 that receives a light beam from the optical source 105 and finely tunes the spectral output of the optical source 105, a beam analysis module 180 that measures one or more properties (such as, for example, the bandwidth) of the light beam 110 that is delivered to the lithography exposure apparatus 115, and a controller 185.

Spectral properties of a light beam output from an optical source include any aspect or representation of an intensity spectrum of the light beam. For example, the bandwidth (or linewidth, which is an estimate of a width of the intensity spectrum) of the light beam is a spectral property.

In general, the controller 185 receives information about the light beam 110 from the optical source 105 and the beam analysis module 180, and information about optical imaging conditions (which are described below) from the lithography exposure apparatus 115, and performs an analysis on the information to determine how to adjust one or more spectral properties (for example, the bandwidth) of the light beam 110 supplied to the lithography exposure apparatus 115. Based on this determination, the controller 185 sends signals to the spectral property selection system 150 to control operation of the optical source 105.

The spectral property selection system 150 can include a control module such as bandwidth control module 152 that includes electronics in the form of any combination of firmware and software. The module 152 is connected to one or more actuation systems such as bandwidth actuation systems 154, 156, 158. Each of the actuation systems 154, 156, 158 can include one or more actuators that are connected to respective optical features 160, 162, 164 of an optical system 166. The optical features 160, 162, 164 are configured to adjust particular characteristics of the generated light beam 110 to thereby adjust the spectral property of the light beam 110. The control module 152 receives a signal 168 from the controller 185, the signal 168 including specific commands to operate or control one or more of the actuation systems 154, 156, 158. The actuation systems 154, 156, 158 can be selected and designed to work together or to work in tandem. Moreover, each of the actuation systems 154, 156, 158 can be optimized to respond to a particular class of disturbances 107. Together such coordination and cooperation can be employed by the controller 185 to hold or maintain the spectral value (such as the bandwidth), at a desired setpoint or at least within a desired range around a setpoint, even though the optical source 105 may be subjected to a wide array disturbances 107.

Each optical feature 160, 162, 164 is optically coupled to the light beam 110 produced by the optical source 105. In some implementations, the optical system 166 that includes the optical features 160, 162, 164 can include dispersive optical elements such as reflective gratings and refractive optical elements such as rotatable prisms. An example of an optical system that includes optical features that are controlled by actuation systems can be found in U.S. application Ser. No. 12/605,306, entitled "System Method and Apparatus for Selecting and Controlling Light Source Bandwidth," and filed on Oct. 23, 2009 (the '306 application), which is incorporated herein by reference in its entirety. In the '306 application, an optical system is described that includes a beam expander (including one or more prisms) and a dispersive element such as a grating.

Each of the actuators of the actuation systems 154, 156, 158 is a mechanical device for moving or controlling the respective optical features 160, 162, 164 of the optical system 166. The actuators receive energy from the module 152, and convert that energy into some kind of motion imparted to the optical features 160, 162, 164 of the optical system 166. For example, in the '306 application, actuation systems are described such as force devices (to apply forces to regions of the grating) and rotation stages for rotating one or more of the prisms of the beam expander. The actuation systems 154, 156, 158 can include, for example, motors such as stepper motors, valves, pressure-controlled devices, piezo-electric devices, linear motors, hydraulic actuators, voice coils, etc.

The beam analysis module 180 includes a spectral value (for example, bandwidth) measurement system 182 that includes at least one sensor that measures the information representative of the spectral property of the light beam 110. In some implementations, the spectral value measurement system 182 uses interferometric or dispersive instruments (such as spectrometers). For example, the spectral value measurement system 182 can include one or more spectrometers having differing impulse response functions such as what is described in U.S. Pat. No. 6,952,267, entitled "Method and Apparatus for Measuring Bandwidth of a Laser Output," issued Oct. 4, 2005 (the '267 patent), which is incorporated herein by reference in its entirety. Each spectrometer provides an output that is representative of a measured parameter related to or containing information about the spectral property (for example, the bandwidth) of the light beam 110. The spectral value measurement system 182 also includes a calculation apparatus that utilizes the spectrometer outputs as part of a system of equations. The equations employ predetermined calibration variables specific to the spectrometer and are used to calculate an estimate of spectral information (for example, the bandwidth) of the light beam 110 according to one or more metrics.

In some implementations, the metric is the spectrum full-width at some percentage or fraction (X) of the maximum value attained (FWXM). In other implementations, the metric is the width of a portion containing some percentage or fraction (Y) of the total energy (EY).

In some implementations, the metric is mean absolute defocus (MAD), a metric that is described in detail in "Laser Bandwidth and Other Sources of Focus Blur in Lithography," T. Brunner, D. Corliss, S. Butt, T. Wiltshire, C. P. Ausschnitt, M. Smith, Optical Microlithography XVIII, Proc. of SPIE, ed. Donis G. Flagello, Vol. 6154, 2006 and will be discussed in greater detail below.

Figure 2:
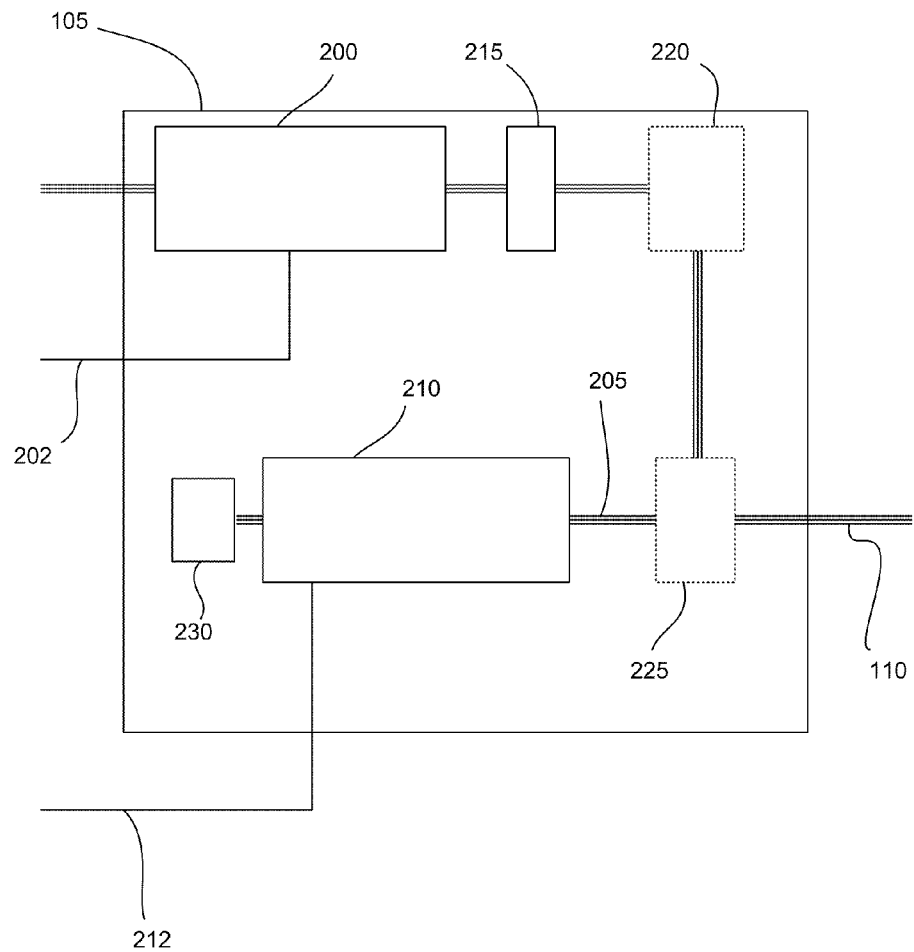
FIG. 2 is a block diagram of an optical source used in the lithography system of FIG. 1.

The optical source 105 can be a pulsed laser source that produces as the light beam 110 a pulsed laser beam. Referring to FIG. 2, in some implementations, the optical source 105 includes a master oscillator (MO) 200 that provides a seed light beam 205 to a power amplifier (PA) 210. The controller 185 is coupled to the master oscillator 200 by way of a connection 202 and to the power amplifier 210 by way of a connection 212. The power amplifier 210 can be, for example, a regenerative ring resonator, as described in U.S. application Ser. No. 12/413,341, entitled "Regenerative Ring Resonator," filed on Mar. 27, 2009, which is incorporated herein by reference in its entirety. The master oscillator 200 enables fine tuning of parameters such as the center wavelength and the bandwidth at relatively low output pulse energies. The power amplifier 210 receives the seed laser beam 205 from the master oscillator 200 and amplifies this output to attain the necessary powers in the light beam 110 (which is a laser beam in this implementation) for output to use in the lithography exposure apparatus 115.

The master oscillator 200 includes a discharge chamber having two elongated electrodes, a laser gas, and a fan for circulating the gas between the electrodes, and a laser resonator is formed between the spectral property selection system 150 on one side of the discharge chamber and an output coupler 215 on a second side of the discharge chamber. The optical source 105 can also include a line center analysis module 220 that receives an output from the output coupler 215 and one or more beam modification optical systems 225 that modify the size and/or shape of the laser beam as needed. The laser gas used in the discharge chamber can be any suitable gas for producing a laser beam at a required wavelength and bandwidth, for example, the laser gas can be argon fluoride (ArF), which emits light at a wavelength of about 193 nm, or krypton fluoride (KrF), which emits light at a wavelength of about 248 nm.

The power amplifier 210 includes a power amplifier discharge chamber, and if it is a regenerative ring amplifier, the power amplifier 210 also includes a beam reflector 230 that reflects the light beam back into the discharge chamber to form a circulating path. The power amplifier discharge chamber includes a pair of elongated electrodes, a laser gas, and a fan for circulating the gas between the electrodes. The seed light beam 205 is amplified by repeatedly passing through the power amplifier 210. The beam modification optical system 225 provides a way (for example, a partially-reflecting mirror) to in-couple the seed light beam 205 and to out-couple a portion of the amplified radiation from the power amplifier 210 to form the output light beam 110.

Referring again to FIG. 1, the lithography exposure apparatus 115 includes an optical arrangement that includes an illuminator system 130 having one or more condenser lenses, a mask 134, and an objective arrangement 132. The mask 134 is movable in along one or more directions, such as along an optical axis 138 of the light beam 110 or in a plane that is perpendicular to the optical axis 138. The lithography exposure apparatus 115 is contained within a sealed chamber that can be maintained at a constant temperature and pressure to reduce distortions in patterns printed on the wafer 120. Moreover, the lithography apparatus 115 can include, among other features, a lithography controller 140, air conditioning devices, and power supplies for the various electrical components. The lithography controller 140 controls how layers are printed on the wafer 120. The illuminator system 130 adjusts the range of angles for the light beam 110 impinging on the mask 134. The illuminator system 130 also homogenizes (makes uniform) the intensity distribution of the light beam 110 across the mask 134. The objective arrangement 132 includes a projection lens and enables the image transfer to occur from the mask 134 to the photoresist on the wafer 120.

The wafer 120 is carried on a wafer stage 142 and an immersion medium 144 can be supplied to cover the wafer 120 for immersion lithography. The wafer 120 is irradiated by the light beam 110. Microelectronic features are typically formed in the wafer 120 by selectively removing material from the wafer 120 and filling in the resulting openings with insulative, semiconductive, or conductive materials.

The microelectronic features can be formed on the wafer 120 by depositing a layer of radiation-sensitive photoresist material on the wafer, then positioning the patterned mask 134 over the photoresist layer, and then exposing the masked photoresist layer to the selected radiation (that is, the light beam 110). The wafer 120 is then exposed to a developer, such as an aqueous base or a solvent. In one case, the photoresist layer is initially generally soluble in the developer, and the portions of the photoresist layer exposed to the radiation through patterned openings in the mask 134 change from being generally soluble to become generally resistant to the developer (for example, so as to have low solubility). Alternatively, the photoresist layer can be initially generally insoluble in the developer, and the portions of the photoresist layer exposed to the radiation through the openings in the mask 134 become more soluble. In either case, the portions of the photoresist layer that are resistant to the developer remain on the wafer 120, and the rest of the photoresist layer is removed by the developer to expose the material of the wafer 120 below.

The wafer 120 is then subjected to etching or metal disposition processes. In an etching process, the etchant removes exposed material, but not material protected beneath the remaining portions of the photoresist layer. Accordingly, the etchant creates a pattern of openings (such as grooves, channels, or holes) in the material of the wafer 120 or in materials deposited on the wafer 120. These openings can be filled with insulative, conductive, or semiconductive materials to build layers of the microelectronic features on the wafer 120. The wafer 120 is then singulated to form individual chips, which can be incorporated into a wide variety of electronic products, such as computers and other consumer or industrial electronic devices.

As the size of the microelectronic features formed in the wafer 120 decreases (for example, to reduce the size of the chip that is formed by the wafer 120), the size of the features formed in the photoresist layer must also decrease. One way to decrease the CD is to increase the numerical aperture (NA) of the projection lens in the objective arrangement 132. However, as the NA of the projection lens increases, the light beam 110 loses depth of focus (DOF) at isolated features. DOF is needed to achieve a higher yield of processed wafers since the manufacturing process requires a variation in focus. As a result of the lower DOF, the yield of processed wafers can be unacceptably low.

One approach to addressing the foregoing problem is a stepper approach that exposes one or more relatively large fields of the wafer 120 to the incoming radiation, and then moves the wafer 120 axially (along the optical axis 138) relative to the incoming radiation (the light beam 110) so that the focal plane of the radiation passes through several strata of the photoresist layer. This process is generally referred to as "focus drilling." During focus drilling, the same part of the wafer 120 is exposed at different focal positions. This is achieved by moving the wafer stage 142 along the optical axis 138 while the stepper shutter is open. The image on the wafer 120 is, therefore, an integration (or superposition) of multi-exposures at different focal positions. This method was developed for stepper tools having wafer stages that did not perform X-, or Y-movement (that is, movement along the plane of the wafer) while the shutter is open. In other words, the wafer stage is in a fixed position in the X or Y-direction relative to the optical source when the relative position of the substrate stage 142 is changed in the Z direction.

In one specific application of this principle (termed focus latitude enhancement exposure or "FLEX"), the wafer 120 is placed on a stepper stage 142 and one field of the wafer 120 is exposed to the light beam 110 passing through the mask 134 and focused at a given depth. The focal plane is then changed to be at a different depth, and the field of the wafer 120 is re-exposed. This process is repeated sequentially for a number of focal plane depths.

Another approach to addressing the foregoing problem is a scanner approach in which the stage 142 moves the wafer 120 along an inclined path as the wafer 120 and the mask 134 scan past each other to align successive portions of the mask 134 with corresponding successive portions of the wafer 120 passing below. The wafer 120 is canted relative to the incoming radiation (the light beam 110) so that the focal plane passes through more than one strata of the photoresist layer as the wafer 120 and the mask 134 move relative to each other.

Another approach to addressing the foregoing problem is to use a light beam 110 having a wider bandwidth spectrum. Most projection lenses (used in the objective arrangement 132) have chromatic aberration, which produces an imaging error on the wafer 120 if there is a wavelength error of the optical source 105. The most dominant error caused by chromatic aberration is focus error and other errors tend to be much smaller. For example, if the wavelength of the light beam 110 is off of the target wavelength, the image on the wafer 120 will have a significant focal plane error. These characteristics can be used for DOF improvement. When a spectrum with a wider bandwidth is used, DOF is improved at most patterns on a wafer 120. Such an approach is described in U.S. Pat. No. 7,088,758, "Relax gas discharge laser lithography light source," issued on Aug. 8, 2006 and in U.S. Pat. No. 7,154,928, "Laser output beam wavefront splitter for bandwidth spectrum control," issued on Dec. 26, 2006, both of which are incorporated herein by reference in their entirety.

In focus drilling, the optical source 105 is operated at a wider bandwidth, for example, at a 0.6 picometer (pm) bandwidth, and has a spectral shape that can be asymmetric. During focus drilling, the critical dimension (CD) at the wafer 120 is measured to ensure that the CD is maintained within an acceptable range of values so that the CD does not vary. The CD can vary with pitch if the spectrum of the optical source 105 varies. Thus, in focus drilling, it is important to minimize or reduce deviations in the optical source spectrum to ensure that the CD deviation is reduced.

To reduce deviation in optical source spectrum (for focus drilling applications, among other application), one needs to have a way to estimate the spectrum of the light beam 110 output from the optical source 105. Fast on-board real-time measurement of the complete spectrum can be very difficult so it is currently more practical to use a metric that estimates a spectral property such as bandwidth to approximate the spectrum of the light beam 110.

As mentioned above, two commonly used metrics for the light beam spectrum are FWHM and E95. However, asymmetric spectral shapes that can be found in focus drilling applications can lead to significant measurement error using simply E95 bandwidth metrology or FWHM metrology, and E95 alone may not be the best metric for correlating large bandwidths (for example, greater than about 0.6 pm) and asymmetric spectra to imaging performance.

Other metrics that incorporate information about the light beam and optical information about the lithography exposure apparatus can be used to better approximate the spectrum. The controller 185 does a better job of approximating the light beam spectrum and also is able to better control the spectral properties of the light beam 110 because the controller 185 receives not only information about the optical source 105 and the light beam 110 from the beam analysis module 180 but also receives optical imaging conditions from the lithography exposure apparatus 115. The controller 185 performs an analysis on the received information and conditions to determine how to adjust the spectral properties of the light beam 110 supplied to the lithography exposure apparatus 115. The controller's analysis provides a better model of the spectrum of the light beam 110 to enable better control of CD and a reduced variation in CD, which is useful, for example, for focus drilling applications. The controller 185 detects CD change in the wafer 120 by changes in the spectral shape by optimizing or improving the metric and feedback to control target patterns at the wafer 120 through simulations or experimental validations. The metric and feedback enable better prediction of the change or variability in CD.

In general, the controller 185 receives information representative of a spectral property (such as, for example, a bandwidth) of the light beam 110 from the beam analysis module 180 and also receives information representative of an optical imaging condition (such as, for example, a numerical aperture of the projection lens) of the lithography exposure apparatus 115 from the lithography exposure apparatus 115.

Figure 3:
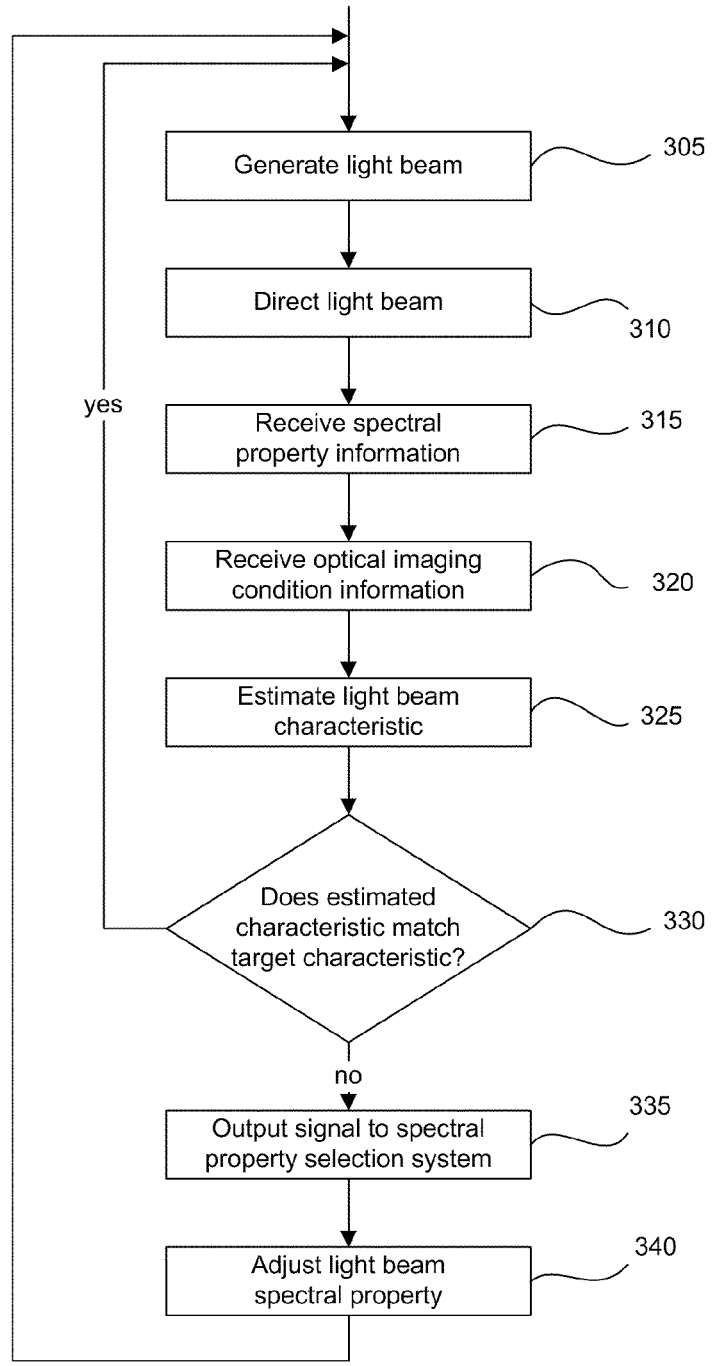
FIG. 3 is a flow chart of a procedure performed by the lithography system of FIG. 1.

Referring to FIG. 3, the lithography system 100 implements a procedure 300 for controlling a spectral property of the light beam 110. The optical source 105 generates the light beam 110 (step 305). The optical source 105 can generate the light beam 110 under control of the controller 185 and based on specific settings in the spectral property selection system 150. The beam directing system 112 directs the light beam 110 toward the lithography exposure apparatus 115 (step 310). The beam analysis module 180 receives at least a portion of the light beam 110 and the spectral value measurement system 182 measures the information representative of the spectral property of the light beam 110. The controller 185 receives the information representative of the spectral property of the light beam 110 from the beam analysis module 180 (step 315). The controller 185 also receives information representative of an optical imaging condition of the lithography exposure apparatus 115 from the lithography exposure apparatus 115 (step 320). An optical imaging condition is a condition that relates to an optical property of components within the lithography exposure apparatus 115. For example, the optical imaging condition can be a numerical aperture of the lens of the objective arrangement 132, conditions within the illuminator system 130 for printing of the wafer pattern, or the pattern of the mask 134.

The term "optical imaging condition" is to be distinguished from mechanical imaging conditions within the lithography exposure apparatus 115 such as the tilt of the stage or vibrations of the stage.

The controller 185 estimates a characteristic value (such as, for example, a bandwidth of the light beam 110 or a focus blur at the wafer 120) based on the received spectral property information and the received optical imaging condition information (step 325).

In some implementations, the controller 185 uses the MAD metric (first mentioned above), which uses information about spectral properties of the light beam 110 that are determined from the module 180, and the controller 185 adjusts the MAD metric calculation to account for changes in an optical imaging condition of the lithography exposure apparatus 115. The MAD metric estimates the light beam spectrum more accurately than the E95 for wider bandwidth optical sources (that is, for sources having bandwidths above about 0.6 pm) and therefore the MAD metric can be used to determine or predict how the CD varies as a function of the light beam spectrum.

The MAD metric relies on the idea that laser bandwidth chromatic errors contribute to focus blur, along with mechanical vibration and tilts of the stage 142, and a measurement of the focus blur can provide information about the laser bandwidth. The MAD metric provides the measurement/estimate of the focus blur. The focus blur estimate provides a distribution of a focus offset z. The focus offset z is related to the bandwidth $(\lambda-\lambda_0)$ of the light beam 110 and a chromatic aberration $(df/d\lambda)$ of the projection lens within the objective arrangement 132 as follows: $z=(df/d\lambda)\times(\lambda-\lambda_0)$.

The MAD metric calculation is:

$$MAD \equiv \overline{|\Delta z|} = \int_{z_1}^{z_2} F_{NET}(z)|z-z_{best}|dz / \int_{z_1}^{z_2} F_{NET}(z)dz,$$

where $F_{NET}(z)$ is the net focus blur distribution. This metric describes the blur of the image that is caused by the bandwidth of the light beam 110. The MAD metric can be given in terms of the wavelength $\lambda$ using the conversion equation above as follows:

$$\frac{df}{d\lambda} \times \int_{\lambda_1}^{\lambda_2} F_{NET}(\lambda)(\lambda-\lambda_0)d\lambda \bigg/ \int_{\lambda_1}^{\lambda_2} F_{NET}(\lambda)d\lambda.$$

Therefore, the MAD metric includes information about a spectral property of the light beam 110 since the term z depends on the measured bandwidth $(\lambda-\lambda_0)$ received from the beam analysis module 180. The focus offset z also depends on the chromatic aberration $(df/d\lambda)$ of the projection lens in the objective arrangement 132. The chromatic aberration of the objective arrangement lens is typically a constant. Moreover, the other two terms in the distribution $F_{NET}$ (namely, the mechanical vibration along the optical axis and the stage tilt) are typically constant. The MAD metric is adjusted to account for the received optical imaging condition information from the lithography exposure apparatus 115 by adjusting the range of integration $(\lambda_1, \lambda_2)$ of the calculation over the net focus blur distribution.

Figure 4:
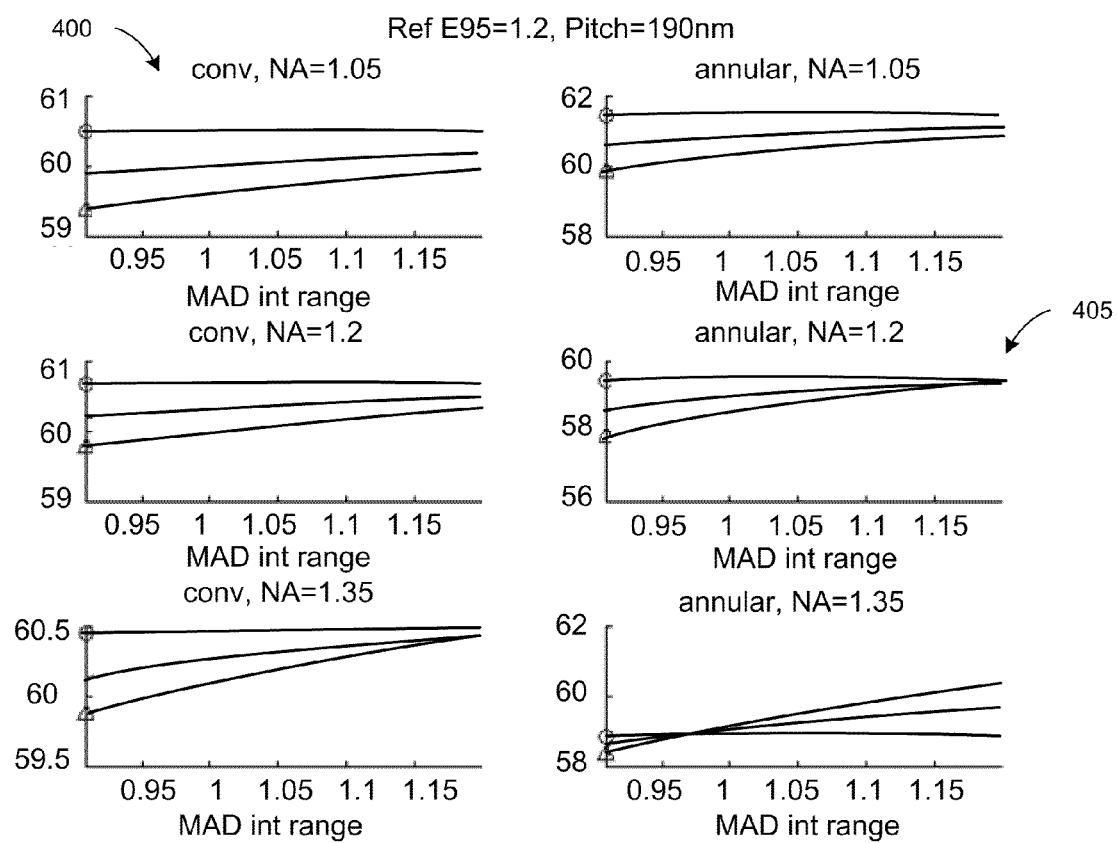
FIG. 4 shows a set of graphs of focus blur distribution values versus integration ranges that depend on optical imaging conditions of a lithography exposure apparatus of the lithography system of FIG. 1.

The graphs shown in FIG. 4 correspond to values of the focus blur bandwidth obtained from the MAD metric calculation versus the integration range $(\lambda_1, \lambda_2)$ for integration ranges from 0.95 to 1.15 pm for various numerical apertures and for two distinct illuminator conditions, one of which is convention illumination ("conv") and the other of which is an annular illumination ("annular"). These data were all taken for a particular mask pattern having a pitch of 190 nm and for a set of test light beam spectra. For example, graph 400 shows the MAD calculation for a numerical aperture of 1.05, a conventional illumination, and a mask pitch of 190 nm. As another example, graph 405 shows the MAD calculation for a numerical aperture of 1.2, an annular illumination, and a mask pitch of 190 nm.

Each graph (and therefore each possible combination of optical imaging conditions) has an optimum integration range for calculating the MAD metric to achieve a particular CD.

For example, for any illumination condition, an optimum MAD measurement integration range $(\lambda_1, \lambda_2)$ can be determined that is insensitive to spectral shape variation. For an annular illumination having a 1.35 NA at the wafer, the integral above can be taken in a range of about 0.95 pm (that is, $\lambda_1-\lambda_2=0.95$ pm). As another example, for a conventional illumination having a 1.35 NA at the wafer, the integral above can be taken in a range of about 1.1 pm (that is, $\lambda_1-\lambda_2=1.1$ pm).

Figure 5:
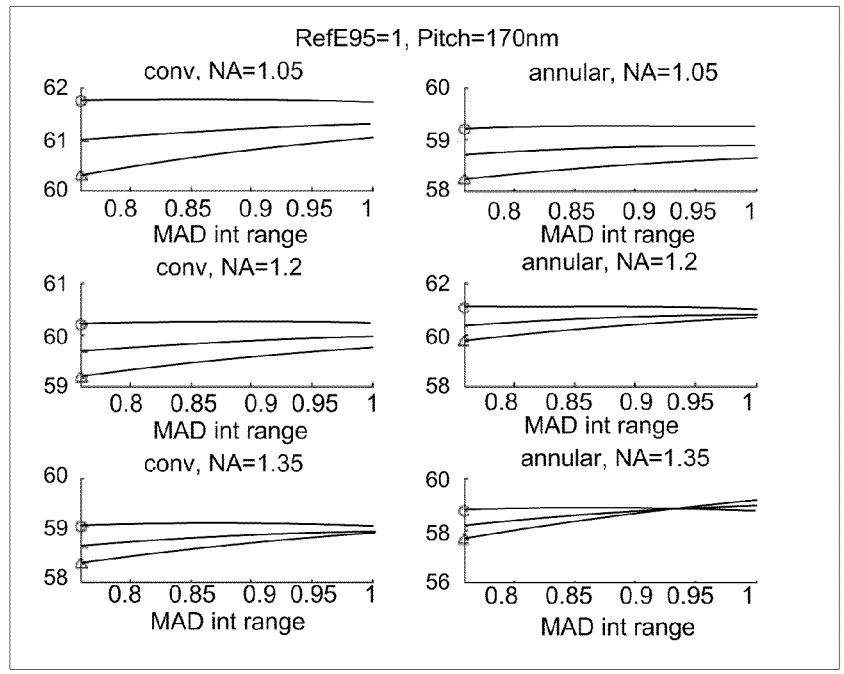
FIGS. 5 and 6 show additional sets of graphs of focus blur distribution values versus integration ranges that depend on optical imaging conditions of a lithography exposure apparatus of the lithography system of FIG. 1.

The graphs shown in FIG. 5 correspond to values of the focus blur bandwidth obtained from the MAD metric calculation versus the integration range $(\lambda_1, \lambda_2)$ for integration ranges from 0.8 to 1.0 pm for numerical apertures of 1.05, 1.2, and 1.35 and for two distinct illuminator conditions, one of which is the convention illumination ("conv") and the other of which is the annular illumination ("annular"). These data were all taken for a particular mask pattern having a pitch of 170 nm and for a set of test light beam spectra.

Figure 6:
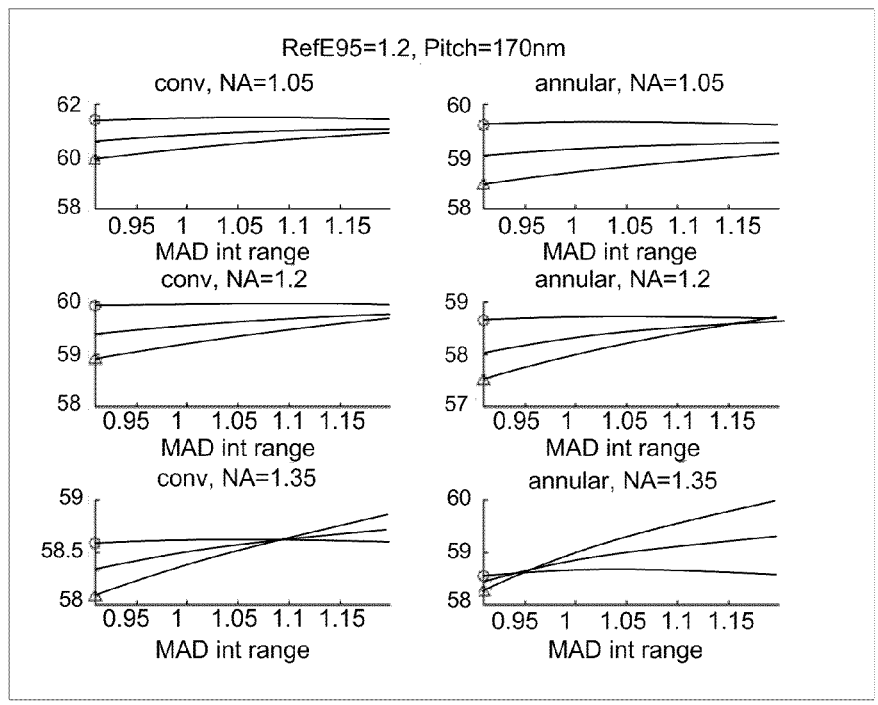

The graphs shown in FIG. 6 correspond to values of the focus blur bandwidth obtained from the MAD metric calculation versus the integration range $(\lambda_1, \lambda_2)$ for integration ranges from 0.95 to 1.15 pm for numerical apertures of 1.05, 1.2, and 1.35 and for two distinct illuminator conditions, one of which is the convention illumination ("conv") and the other of which is the annular illumination ("annular"). These data were all taken for a particular mask pattern having a pitch of 170 nm and for a set of test light beam spectra.

Referring again to FIG. 3, the controller 185 determines whether the estimated characteristic value matches a target characteristic value (step 330). The estimated characteristic value may not match the target characteristic value due to various disturbances 107 (such as temperature gradients, pressure gradients, optical distortions, etc.) that act on the optical source 105 and the light beam 110. If the controller 185 determines that the estimated characteristic value does not match the target characteristic value, the controller 185 outputs a signal to the spectral property selection system 150 indicating an adjustment based on the determination (step 335). The spectral property selection system 150, based on the signal it receives from the controller 185, adjusts the spectral property of the light beam 110 (step 340), with the goal of maintaining the CD constant. For example, if the spectral property of the light beam 110 is the bandwidth, then the controller 185 determines whether an estimated bandwidth matches a target bandwidth and the spectral property selection system 150 is configured to adjust the bandwidth of the light beam 110 output by the optical source 105.

Using the example discussed above, if the controller 185 uses a modified MAD metric to estimate as the characteristic value a focus blur bandwidth, then this estimated focus blur bandwidth can be compared to a target focus blur bandwidth in step 330. The target focus blur bandwidth can be a value that depends on the particular application, that is, the pattern to be formed on the wafer. For example, for one particular focus drilling application, the controller 185 controls the optical source 105 to a target focus blur of 180 nm (in the case in which the chromatic aberration is 300 nm/pm) and if the stage tilt adds 60 nm of focus blur, then the controller 185 adjusts the optical source 105 to produce a optical source spectrum that would deliver 120 nm of focus blur.

While the MAD metric is described as being a potential metric that can be used to estimate or approximate the spectrum of the light beam, other possible metrics that can be derived from the full spectrum can be used. For example, 2nd moment, standard statistical symmetry parameters such as skewness/kurtosis, or some other calculation/model can be used. Thus, the metrics are calculated and/or derived from the direct measurement of the spectrum on-board the optical source 105 and from optical imaging condition information received from the lithography exposure apparatus 115 to actively control the optical source 105 and minimize or reduce CD variation. Therefore, active control is based on the actual spectrum measured on board the optical source 105 during operation. Assuming the spectrum is available on a pulse-to-pulse basis from the new on-board metrology, the model for the CD impact can be generated from the spectrum measurement on a pulse-to-pulse basis and devise some actuation scheme to control to CD directly.

In some implementations, the output of the beam analysis module 180 can be displayed for external process monitoring.

In other implementations, the controller 185 can use not only information received from the beam analysis module 180 and the optical imaging condition information from the lithography exposure apparatus 115, but also information about mechanical imaging conditions from the lithography exposure apparatus 115, or information from other laser signals, for example, relating to target energy and duty cycle compensations. The controller 185 can use information related to known non-flatness maps of the wafer 120 or non-flatness maps of the mask 134, or aberrations of lenses such as spherical aberration.

While the lithography system 100 described herein is useful for focus drilling applications, it can be used in non-focus drilling applications that require improved control of the spectral properties of the light beam and/or improved control of CD at the wafer 120.

The controller 185 can include one or more of digital electronic circuitry, computer hardware, firmware, and software. The controller 185 can also include appropriate input and output devices, a computer processor, and a computer program product tangibly embodied in a machine-readable storage device for execution by a programmable processor. The procedure embodying the techniques (discussed above) may be performed by a programmable processor executing a program of instructions to perform desired functions by operating on input data and generating appropriate output. Generally, a processor receives instructions and data from a read-only memory and/or a random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially-designed ASICs (application-specific integrated circuits).

Other implementations are within the scope of the following claims.

What is claimed is:

1. A method of controlling a spectral property of a light beam, the method comprising:

directing a light beam generated by an optical source to a lithography exposure apparatus configured to create a pattern on a wafer;

receiving information representative of a spectral property of the light beam from one or more of the optical source and a beam analysis module in the path of the directed light beam;

receiving information representative of an optical imaging condition relating to an optical property of one or more components within the lithography exposure apparatus from the lithography exposure apparatus;

approximating the spectrum of the light beam by calculating a metric that includes both the received spectral property information and the received optical imaging condition information;

estimating a characteristic value of the light beam based on the calculated metric;

determining whether the estimated light beam characteristic value matches a target light beam characteristic value; and if it is determined that the estimated light beam characteristic value does not match the target light beam characteristic value, adjusting the spectral property of the light beam.

2. A method of controlling a spectral property of a light beam, the method comprising:

directing a light beam produced by an optical source to a lithography exposure apparatus configured to create a pattern on a wafer;

receiving information representative of a spectral property of the light beam from one or more of the optical source and a beam analysis module in the path of the directed light beam;

receiving information representative of an optical imaging condition of the lithography exposure apparatus from the lithography exposure apparatus;

estimating a characteristic value of the light beam based on the received spectral property information and the received optical imaging condition information;

determining whether the estimated light beam characteristic value matches a target light beam characteristic value; and if it is determined that the estimated light beam characteristic value does not match the target light beam characteristic value, adjusting the spectral property of the light beam;

wherein estimating the light beam characteristic value includes estimating a width of a focus blur distribution of the light beam.

3. The method of claim 1, wherein estimating the light beam characteristic value includes estimating a bandwidth of the light beam.

4. The method of claim 1, wherein adjusting the light beam spectral property includes adjusting a bandwidth of the light beam.

5. The method of claim 1, wherein receiving the spectral property information includes receiving a measured bandwidth of the light beam.

6. The method of claim 1, wherein receiving the optical imaging condition information includes receiving a numerical aperture of projection optics within the lithography exposure apparatus.

7. The method of claim 1, wherein receiving the optical imaging condition information includes receiving information about the pattern to be printed on the wafer.

8. The method of claim 1, wherein receiving the optical imaging condition information includes receiving conditions of an illuminator for the printing of the wafer pattern.

9. The method of claim 1, wherein adjusting the light beam spectral property includes adjusting a bandwidth of the light beam within a first range of bandwidths while operating in a first range mode.

10. The method of claim 9, wherein adjusting the light beam spectral property includes adjusting the bandwidth of the light beam within a second range of bandwidths while operating in a second range mode.

11. The method of claim 1, further comprising receiving information representative of a mechanical imaging condition of the lithography exposure apparatus, wherein:
estimating the light beam characteristic value is based on the received spectral property information, the received optical imaging condition information, and the received mechanical imaging condition information.

12. A light system that produces a light beam configured to be directed to a lithography exposure apparatus that creates a pattern on a wafer, the light system comprising:
an optical source configured to generate the light beam;
a beam analysis module in the path of the generated light beam and configured to measure spectral property information of the light beam;
a beam directing system configured to direct the light beam to the lithography exposure apparatus;
a controller configured to:
receive information representative of a spectral property of the light beam from one or more of the optical source and the beam analysis module;
receive information representative of an optical imaging condition relating to an optical property of one or more components within the lithography exposure apparatus from the lithography exposure apparatus;
calculate a metric that includes both the received spectral property information and the received optical imaging condition information;
estimate a characteristic value of the light beam based on the calculated metric;
determine whether the estimated light beam characteristic value matches a target light beam characteristic value; and
if it is determined that the estimated light beam characteristic value does not match the target light beam characteristic value, outputting a signal indicating an adjustment based on the determination; and
a spectral property selection system that receives the outputted signal and is configured to adjust a spectral property of the light beam.

13. The light system of claim 12, wherein the controller is configured to estimate the light beam characteristic value by estimating a width of a focus blur distribution of the light beam.

14. The light system of claim 12, wherein the controller is configured to estimate the light beam characteristic value by estimating a width of a spectrum of the light beam.

15. The light system of claim 12, wherein the spectral property selection system comprises:
a spectral property control module; and
one or more spectral property actuation systems connected to respective optical features that are optically coupled to the light beam of the optical source.

16. The light system of claim 12, wherein the spectral property selection system comprises at least two spectral property actuation systems that enable adjustment of the light beam spectral property in two or more distinct ranges of properties.

17. The light system of claim 12, wherein the spectral property selection system adjusts the light beam spectral property by adjusting a bandwidth of the light beam.

18. The light system of claim 12, wherein the beam analysis module includes a spectral value measurement system that includes at least one sensor that measures the information representative of the spectral property of the light beam.

19. The light system of claim 18, wherein the spectral value measurement system includes one or more of interferometric or dispersive instruments.

20. The method of claim 1, wherein estimating the light beam characteristic value includes estimating a width of a focus blur distribution of the light beam.

* * * * *